(12) United States Patent
Jeon

(10) Patent No.: US 9,299,713 B2
(45) Date of Patent: Mar. 29, 2016

(54) THREE-DIMENSIONAL NONVOLATILE MEMORY DEVICE

(71) Applicant: SK hynix Inc., Gyeonggi-do (KR)

(72) Inventor: Yoo Nam Jeon, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 35 days.

(21) Appl. No.: 13/830,285

(22) Filed: Mar. 14, 2013

(65) Prior Publication Data

US 2014/0042512 A1 Feb. 13, 2014

(30) Foreign Application Priority Data

Aug. 9, 2012 (KR) .................. 10-2012-0087280

(51) Int. Cl.
*H01L 27/115* (2006.01)
*H01L 27/105* (2006.01)

(52) U.S. Cl.
CPC ...... *H01L 27/11556* (2013.01); *H01L 27/1052* (2013.01); *H01L 27/1157* (2013.01); *H01L 27/11524* (2013.01); *H01L 27/11531* (2013.01); *H01L 27/11573* (2013.01); *H01L 27/11582* (2013.01)

(58) Field of Classification Search
None
See application file for complete search history.

(56) References Cited

U.S. PATENT DOCUMENTS

| 2010/0327339 | A1 | 12/2010 | Tanaka et al. | |
|---|---|---|---|---|
| 2011/0057250 | A1* | 3/2011 | Higashi | 257/324 |
| 2012/0168858 | A1* | 7/2012 | Hong | 257/330 |
| 2012/0299082 | A1* | 11/2012 | Park | 257/319 |

\* cited by examiner

*Primary Examiner* — Daniel Luke
(74) *Attorney, Agent, or Firm* — IP & T Group LLP

(57) ABSTRACT

A semiconductor device includes word lines stacked in a cell region of a substrate and each of the word lines includes a first conductive layer. At least one selection line is stacked on top of the word lines and includes a second conductive layer. At least one gate line is formed in a peripheral region of the substrate and includes the second conductive layer.

4 Claims, 5 Drawing Sheets

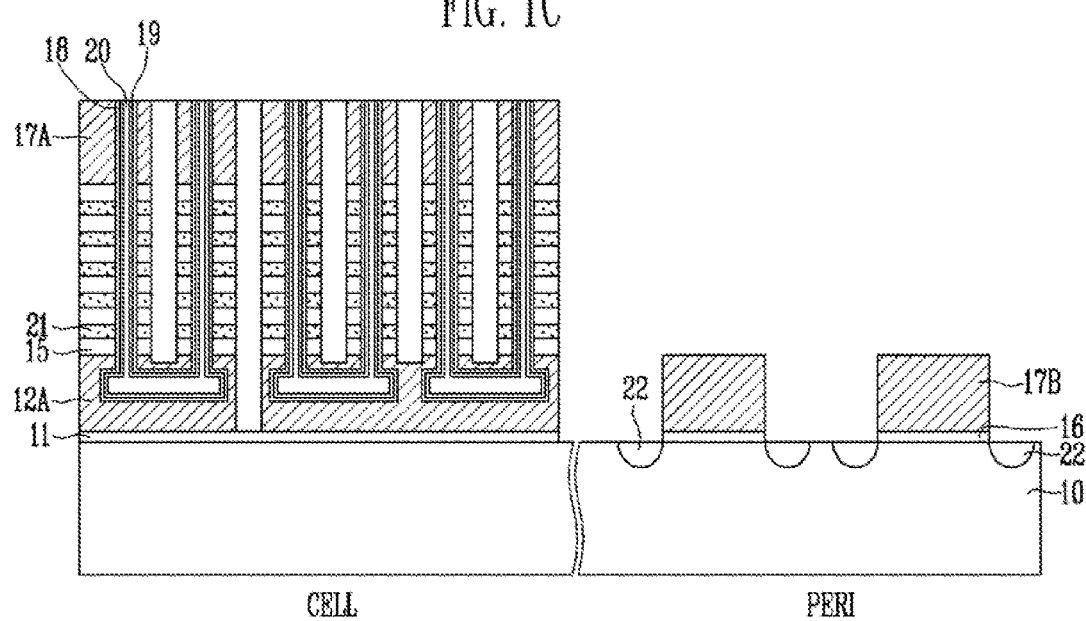

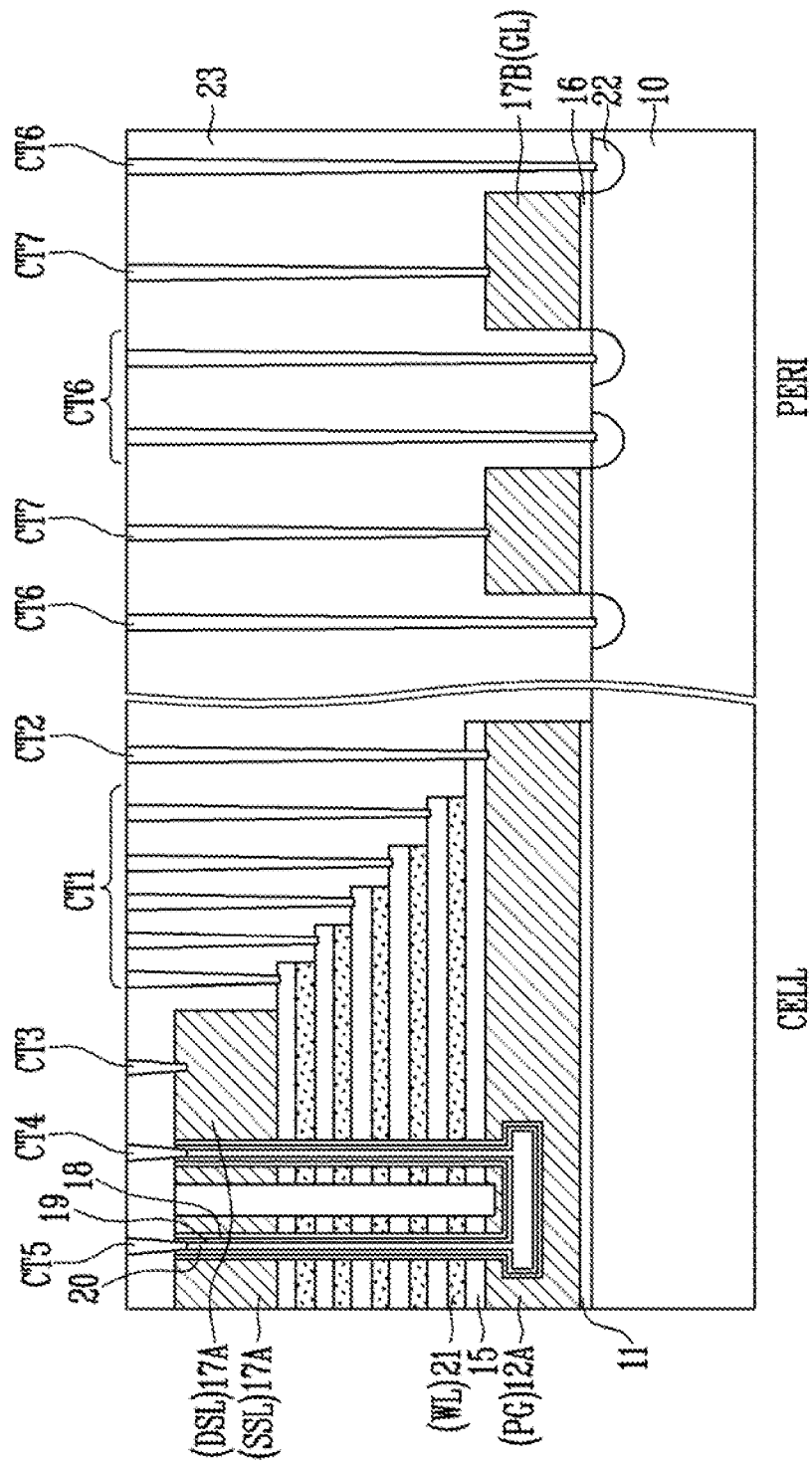

THREE-DIMENSIONAL NONVOLATILE MEMORY DEVICE

CROSS-REFERENCE TO RELATED APPLICATION

Priority is claimed to Korean patent application number 10-2012-0087280, filed on Aug. 9, 2012, the entire disclosure of which is incorporated herein by reference in its entirety.

BACKGROUND

1. Field of Invention

Embodiments of the present invention relate to a semiconductor device and a method of manufacturing the same and, more particularly, to a three-dimensional non-volatile memory device and a method of manufacturing the same.

2. Description of Related Art

A non-volatile memory retains data stored therein even when not powered. Two-dimensional memory devices in which memory cells are fabricated in a single layer over a silicon substrate have reached physical limits in increasing their degree of integration. Accordingly, three-dimensional (3D) non-volatile memory devices in which memory cells are stacked in a vertical direction over a silicon substrate have been proposed.

When a conventional 3D non-volatile memory device is manufactured, word lines and selection lines use the same processes and include conductive layers having the same thickness.

While the memory device is being driven, a bias appropriate for a program or erase operation needs to be applied to the selection lines. In addition, leakage current of the selection transistors needs to be reduced in order to prevent program interference. However, leakage current nay be difficult to control with the selection lines having the same thickness as the word lines.

Therefore, a method of stacking a plurality of selection transistors one on top of another has been conventionally used to control leakage current of selection transistors. According to this method, a single string includes a plurality of drain selection transistors and a plurality of source selection transistors.

However, if the number of selection transistors stacked on top of one another increases, processes such as an etch process for forming a channel hole and an etch process for forming a contact pad may become more difficult. In addition, an increase in the area of the contact pad may impose limitations in improving a degree of integration of a memory device.

BRIEF DESCRIPTION OF THE DRAWINGS

FIGS. 1A to 1D are cross-sectional views illustrating a process flow for manufacturing an exemplary semiconductor device;

DESCRIPTION OF EMBODIMENTS

Figure 1A:
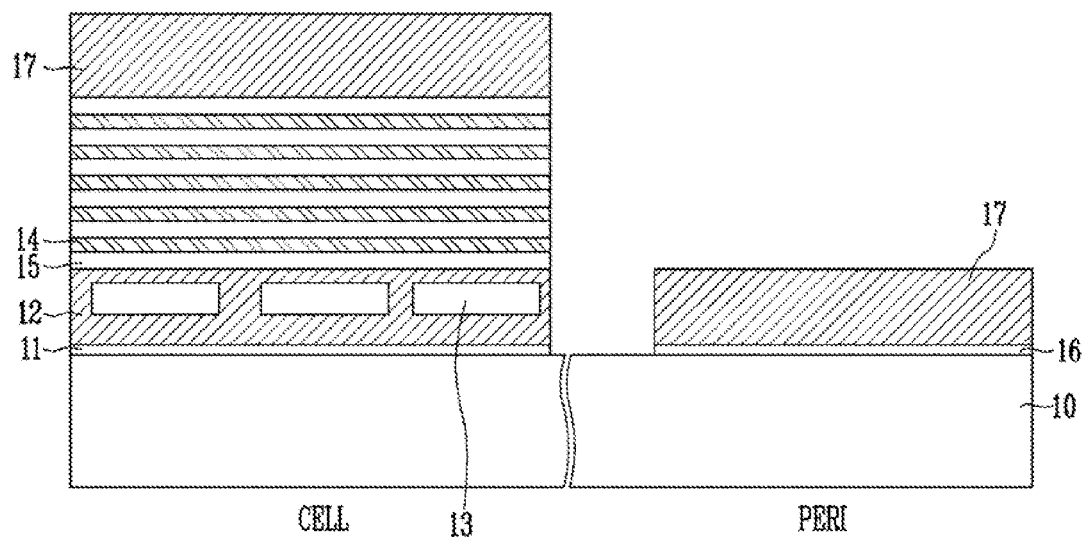

Hereinafter, various embodiments of the present invention will be described with reference to the accompanying drawings. In the drawings, a thicknesses and a distance of components are exaggerated compared to an actual physical thickness and interval for convenience of illustration. In the following description, detailed explanation of known related functions and constitutions may be omitted to avoid unnecessarily obscuring the subject manner of the present invention. Like reference numerals refer to like elements throughout the specification and drawings.

It should be readily understood that the meaning of "on" and "over" in the present disclosure should be interpreted in the broadest manner such that "on" not only means "directly on" something but also includes the meaning of "on" something with an intermediate feature or a layer therebetween, and that "over" not only means the meaning of "over" something but may also include the meaning it is "over" something with no intermediate feature or layer therebetween (i.e., directly on something).

FIGS. 1A to 1D are cross-sectional views illustrating a process flow for manufacturing an exemplary semiconductor device.

As illustrated in FIG. 1A, an insulating layer 11 and a first conductive layer 12 that serves as a pipe gate may be sequentially formed in a cell region CELL of a substrate 10. The first conductive layer 12 may include a conductive layer, such as a polysilicon layer or a metal layer.

Subsequently, the first conductive layer 12 may be etched to form trenches, and sacrificial layers 13 may be formed in the trenches. Each of the sacrificial layers may include a nitride layer or a titanium nitride layer. Subsequently, another first conductive layer 12 may be formed over the first conductive layer 12 where the sacrificial layers 13 are formed. The entire surface of a pipe channel layer may be surrounded by a pipe gate by adding another first conductive layer 12, so that cell current may be improved.

Subsequently, first material layers 14 and second material layers 15 may be alternately formed over the first conductive layer 12 where the sacrificial layers 13 are formed. The first material layers 14 may be stacked to form word lines, and the second material layers 15 may separate the stacked word lines from each other.

The first material layers 14 may be formed of materials having a high etch selectivity with the second material layers 15. For example, the first material layers 14 may include conductive layers, such as polysilicon layers, and the second material layers 15 may include insulating layers, such as oxide layers. In another example, the first material layers 14 may include conductive layers, such as doped polysilicon layers or doped amorphous silicon layers. The second material layers 15 may include sacrificial layers, such as undoped polysilicon layers or undoped amorphous silicon layers. In yet another example, the first material layers 14 may include sacrificial layers, such as nitride layers. The second material layers 15 may include insulating layers, such as oxide layers. A description of an exemplary embodiment will be made in reference to a case in which the first material layers 14 include sacrificial layers, and the second material layers 15 include insulating layers.

The first conductive layer 12, the sacrificial layers 13, the first material layers 14 and the second material layers 15 may be finally formed in the cell region CELL of the substrate 10. For example, the first conductive layer 12, the first material layers 14 and the second material layers 15 may be formed only in the cell region CELL of the substrate 10. Alternatively, after the first conductive layer 12, the first material layers 14 and the second material layers 15 may be formed in the cell region CELL and a peripheral region PERI in the substrate 10, the first conductive layer 12, the first material layers 14 and the second material layers 15 may be selectively removed from the peripheral region PERI.

Subsequently, a gate insulating layer 16 may be formed in the peripheral region PERI of the substrate 10, and a second conductive layer 17 may be formed in the cell region CELL and the peripheral region PERI of the substrate 10. Here, in the cell region CELL, the second conductive layer 17 may be formed over the first material layers 14 and the second material layers 15 that are formed alternately with each other. In addition, in the peripheral region PERI, the second conductive layer 17 may be formed on the gate insulating layer 16.

Figure 1B:
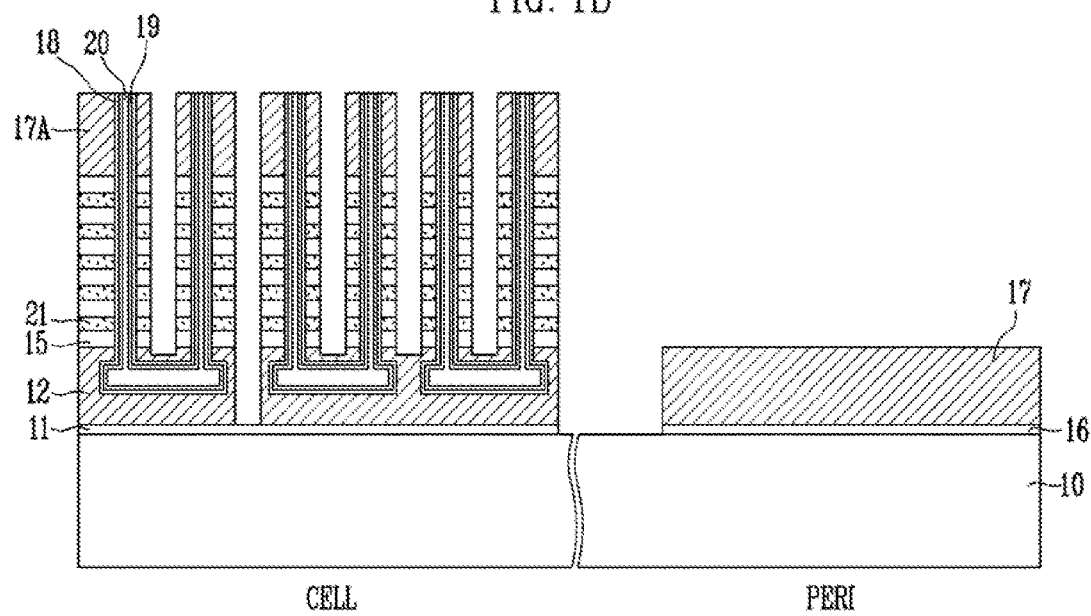

As illustrated in FIG. 1B, memory cells may be stacked in the cell region CELL of the substrate 10.

First, channel holes may be formed through the second conductive layer 17, the first material layers 14, the second material layers 15 and the first conductive layer 12, so that the channel holes may communicate with the trenches. For example, at least one pair of the channel holes may communicate with each of the trenches. Subsequently, the sacrificial layers 13 exposed at bottom surfaces of the channel holes may be removed, and memory layers 18 may be formed along inner surfaces of the trenches and the channel holes. Each of the memory layers 18 may include a charge blocking layer, a charge storing layer, and a tunnel insulating layer. The charge storing layer may include a floating gate, such as a polysilicon layer, which can store a charge, a trap layer, such as a nitride layer, which can trap a charge, or nanodots. For reference, the memory layer 18 may include a phase-change material layer instead of the charge storing layer.

Subsequently, channel layers 19 may be formed on the respective memory layers 18. Each of the channel layers 19 formed in the trenches may be used as a pipe channel layer, and each of the channel layers 19 formed in the channel holes may be used as cell channel layers. For example, a pipe channel layer may couple bottom portions of a pair of cell channel layers to each other. In addition, the channel layers 19 may completely fill the channel holes and the trenches or have open central portions. The open central portions of the channel layers 19 may be filled with insulating layers 20.

Subsequently, one or more slits may be formed through the second conductive layer 17, the first material layers 14 and the second material layers 15. Here, the one or more slits may be deep enough to expose all the first material layers 14. The one or more slits may be formed using an etch process. During the etch process, the first conductive layer 12 may function as an etch stop layer, and the first conductive layer 12 may be over-etched to a predetermined thickness. Here, the second conductive layer 17 formed in the cell region CELL may be etched to form selection lines 17A.

Subsequently, the first material layers 14 exposed through the one or more slits may be removed to form recessed regions. The recessed regions may be filled with third conductive layers to form word lines 21. Each of the third conductive layers may include a metal layer, such as a tungsten (W) layer. Before the third conductive layers are formed, a charge blocking layer may be further formed along inner surfaces of the recessed regions.

As illustrated in FIG. 1C, the first conductive layer 12 in the cell region CELL may be etched so that the first conductive layer 12 may be divided into units of memory blocks. The first conductive layer 12, divided into units of memory blocks, may be used as pipe gates 12A. Here, the second conductive layer 17, formed in the peripheral region PERI, may also be etched to form gate lines 17B.

As a result, the second conductive layer 17, formed in the cell region CELL of the substrate 10, may be used as the selection lines 17A, and the second conductive layer 17, formed in the peripheral region PERI of the substrate 10, may be used as the gate lines 17B.

Subsequently, the substrate 10 at both sides of each of the gate lines 17B may be doped with an impurity to form junctions 22. An interlayer insulating layer 23 may then be formed over the entire structure including the junctions 22.

Subsequently, contact holes may be formed through the interlayer insulating layer 23. Conductive layers may be formed through the contact holes to form first to seventh contact plugs CT1 to CT7. Here, the first to fifth contact plugs CT1 to CT5 may be formed in the cell region CELL, and the sixth and seventh contact plugs CT6 and CT7 may be formed in the peripheral region PERI.

The first contact plugs CT1 may be coupled to the word lines 21, the second contact plug CT2 may be coupled to the pipe gate 12A, the third contact plug CT3 may be coupled to the selection line 17A, the fourth contact plug CT4 may be coupled to a drain side channel layer, and the fifth contact plug CT5 may be coupled to a source side channel layer. In addition, the sixth contact plugs CT6 may be coupled to the junctions 22, and the seventh contact plugs CT7 may be coupled to the gate lines 17B.

Here, the first to seventh contact plugs CT1 to CT7 may be formed simultaneously or separately.

According to an exemplary embodiment, as described above, since selection lines and word lines are formed through separate processes, leakage current may be easily controlled by adjusting channel lengths of selection transistors. In addition, gate lines in the peripheral region PERI may be formed at the same time as the selection lines in the cell region CELL are formed. Therefore, manufacturing processes may be simplified.

According to an exemplary embodiment, a description has been made in reference to a case in which the selection lines 17A and the gate lines 17B are formed using the second conductive layer 17 formed in the cell region CELL and the peripheral region PERI of the substrate 10. However, the present invention is not limited thereto. For example, the insulating layer 11 and the first conductive layer 12 may be formed in the cell region CELL and the peripheral region PERI of the substrate 10, and gate lines may be formed using the first conductive layer 12 formed in the peripheral region PERI.

Figure 2:
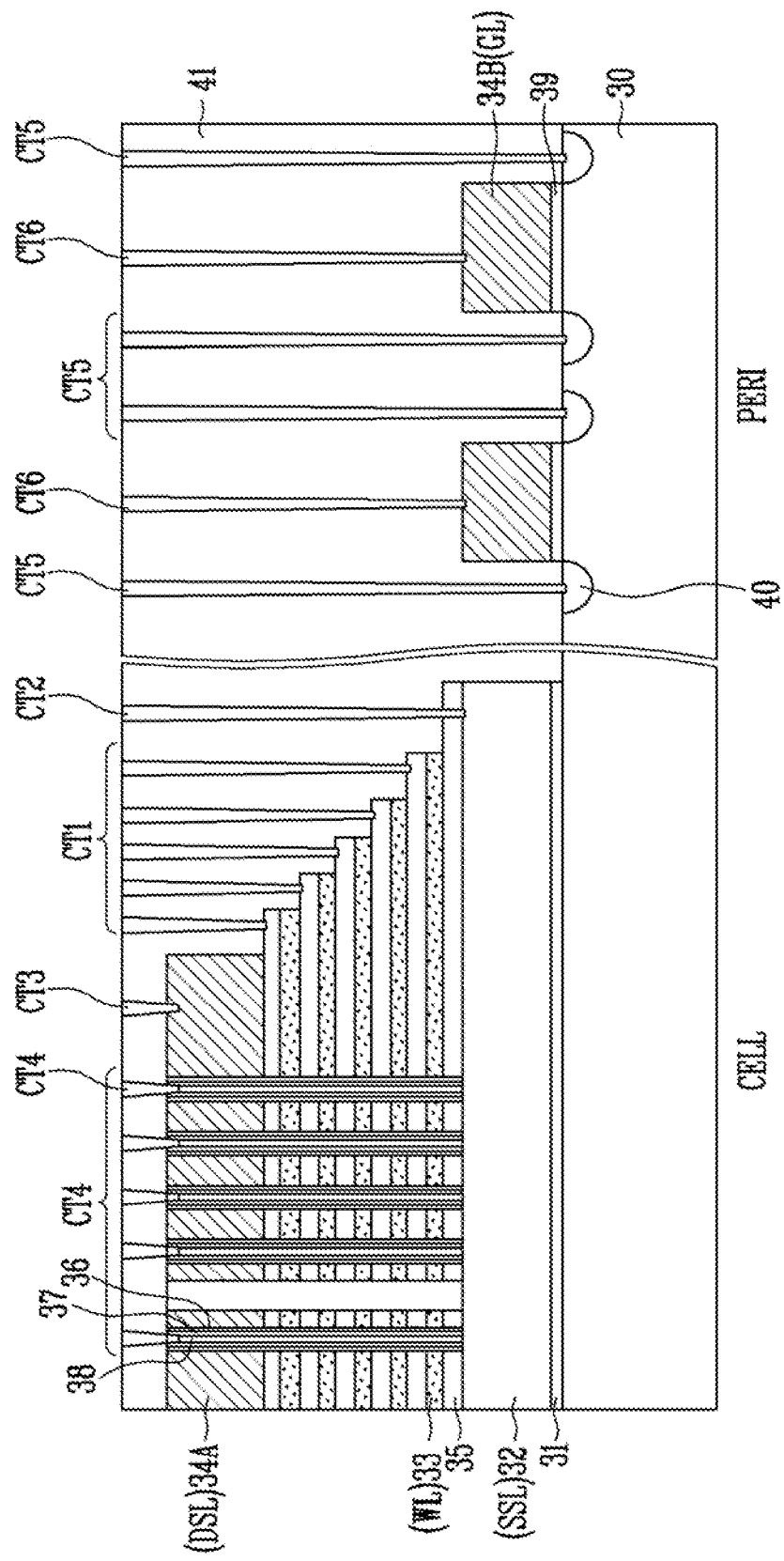
FIG. 2 is a cross-sectional view illustrating a process flow for manufacturing an exemplary semiconductor device.

FIG. 2 is a cross-sectional view illustrating a process flow for manufacturing a semiconductor device according to a second embodiment of the present invention.

As illustrated in FIG. 2, a semiconductor device according to an exemplary embodiment may include an insulating layer 31, a first conductive layer 32 formed at one level, a plurality of second conductive layers 33, and a third conductive layer 34A that are sequentially stacked in the cell region CELL of a substrate 30. Interlayer insulating layers 35 may be interposed between the plurality of second conductive layers 33.

In addition, the semiconductor device may include a gate insulating layer 39 gate lines 34B (second conductive layer in PERI region) and junctions 40. The gate insulating layer 39 may be stacked in the peripheral region PERI of the substrate 30. The junctions 40 may be formed in the substrate 30 at both sides of each of the gate lines 34B.

The first conductive layer 32 may include a conductive layer, such as a polysilicon layer or a metal layer and be used as a source selection line. Each of the plurality of second conductive layers 33 may include a metal layer, such as a tungsten layer and be used as a word line. In addition, each of the third conductive layers 34A and 34B may include a polysilicon layer. The third conductive layer 34A formed in the cell region CELL may be used as a drain selection line, and the third conductive layer 34B formed in the peripheral region PERI may be used as a gate line.

Hereinafter, a method of manufacturing an exemplary semiconductor device will be described.

First, the insulating layer 31 and the first conductive layer 32 configured as a selection line may be formed in the cell region CELL of the substrate 30. Subsequently, first material layers and second material layers may be alternately formed over the first conductive layer 32. Here, the first material layers include sacrificial layers, and the second material layers include the interlayer insulating layers 35.

Subsequently, the gate insulating layer 39 may be formed in the peripheral region PERI of the substrate 30, and the third conductive layers 34A and 34B may be formed in the cell region CELL and the peripheral region PERI of the substrate 30.

Subsequently, channel holes may be formed through the third conductive layer 34A, the first material layers, the second material layers, the first conductive layer 32 and the insulating layer 31 in the cell region CELL. Subsequently, memory layers 36 may be formed along inner surfaces of the channel holes. Each of the memory layers 36 may include a charge blocking layer, a charge storing layer, and a tunnel insulating layer.

Subsequently, a channel layer 37 may be formed on the memory layer 36. When the channel layer 37 has an open central portion, the open central portion may be filled with an insulating layer 38.

Subsequently, slits may be formed through the third conductive layer 34A, the first material layers and the plurality of second material layers between the channel holes. The first material layers exposed through the slits may be removed. Subsequently, the plurality of second conductive layers 33 may be formed in regions from which the first material layers are removed.

Subsequently, the first conductive layer 32, which defines a bottom surface of the slits, may be etched so that the first conductive layer 32 may be divided into units of memory blocks. At this time, the third conductive layer 34B formed in the peripheral region PERI may also be etched to form gate lines.

Subsequently, the substrate 30 at both sides of each of the third conductive layers 34B may be doped with an impurity to form the junctions 40. Subsequently, an interlayer insulating layer 41 may be formed over the entire structure including the junctions 40.

Subsequently, contact holes may be formed through the interlayer insulating layer 41, and the contact holes may be filled with conductive layers to form the first to sixth contact plugs CT1 to CT6. Here, the first to fourth contact plugs CT1 to CT4 may be formed in the cell region CELL, and the fifth and sixth contact plugs CT5 and CT6 may be formed in the peripheral region PERI.

The first contact plugs CT1 may be coupled to the plurality of second conductive layers 33, the second contact plug CT2 may be coupled to the first conductive layer 32, the third contact plug CT3 may be coupled to the third conductive layer 34A, and the fourth contact plugs CT4 may be coupled to the channel layers 37. In addition, the fifth contact plugs CT5 may be coupled to the junctions 40, and the sixth contact plugs CT6 may be coupled to the gate lines 34B.

Figure 3:
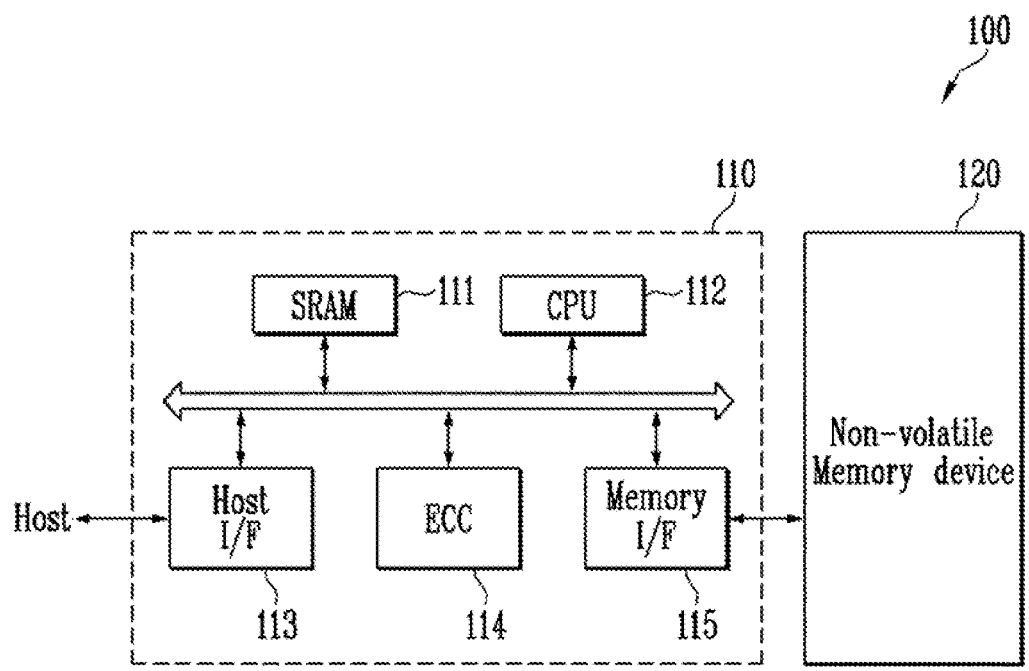
FIG. 3 is a block diagram illustrating a configuration of an exemplary memory system.

FIG. 3 is a block diagram illustrating the configuration of an exemplary memory system.

As illustrated in FIG. 3, a memory system 100 according to an embodiment of the present invention may include a non-volatile memory device 120 and a memory controller 110.

The non-volatile memory device 120 may have the structure according to an exemplary embodiment, as described above. In addition, the non-volatile memory device 120 may be a multi-chip package composed of a plurality of flash memory chips.

The memory controller 110 may be configured to control the non-volatile memory device 120. The memory controller 110 may include SRAM 111, a CPU 112, a host interface 113, an ECC 114, and a memory interface 115. The SRAM 111 may function as an operation memory of the CPU 112. The CPU 112 may perform the general control operation for data exchange of the memory controller 110. The host interface 113 may include a data exchange protocol of a host being coupled to the memory system 100. In addition, the ECC 114 may detect and correct errors included in a data read from the non-volatile memory device 120. The memory interface 115 may interface with the non-volatile memory device 120. The memory controller 110 may further include ROM that stores code data to interface with the host.

The memory system 100 having the above-described configuration may be a solid state disk (SSD) or a memory card in which the memory device 120 and the memory controller 110 are combined. For example, if the memory system 100 is an SSD, then the memory controller 110 may communicate with the outside (e.g., a host) through one of the interface protocols including USB, MMC, PCI-E, SATA, PATA, SCSI, ESDI, or IDE.

Figure 4:
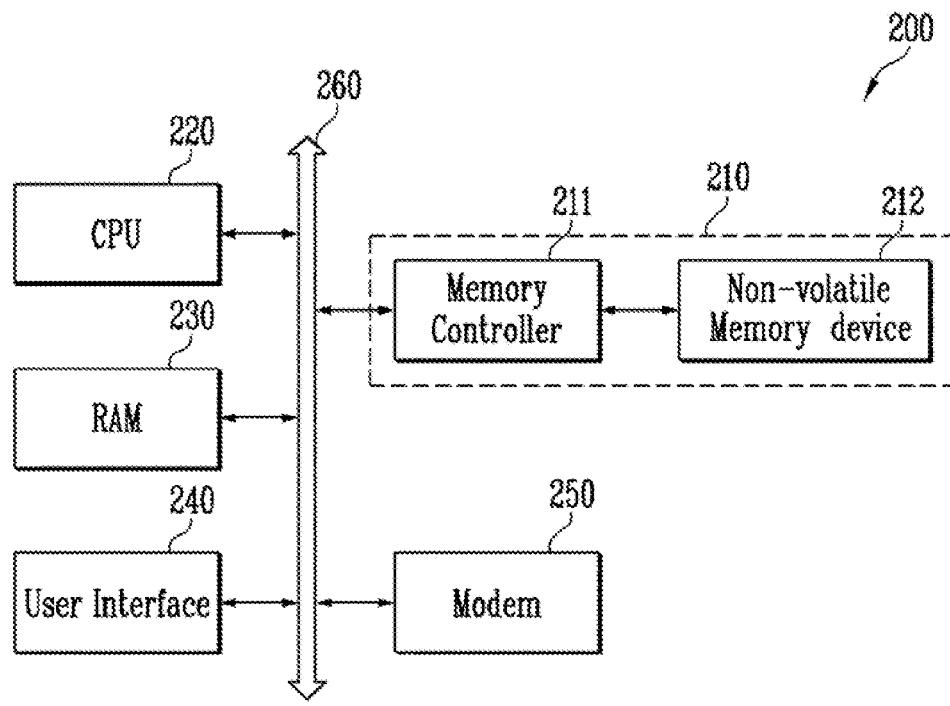
FIG. 4 is a block diagram illustrating a configuration of a computing system.

FIG. 4 is a block diagram illustrating a configuration of an exemplary computing system.

As illustrated in FIG. 4, a computing system 200 according to an embodiment of the present invention may include a CPU 220, RAM 230, a user interface 240, a modern 250 and a memory system 210 that are electrically coupled to a system bus 260. In addition, when the computing system 200 is a mobile device, battery may be further included to apply operating voltage to the computing system 200. The computing system 200 may further include application chipsets, a CMOS Image Sensor (CIS) and mobile DRAM.

As described above with reference to FIG. 3, the memory system 210 may include a non-volatile memory device 212 and a memory controller 211.

According to exemplary embodiments of the present invention, a semiconductor device may include word lines including metal layers, selection lines including polysilicon layers and gate lines including polysilicon layers. Therefore, leakage current may be easily controlled by adjusting channel lengths of selection transistors.

While the present invention has been described with respect to exemplary embodiments, it will be apparent to those skilled in the art that various changes and modifications may be made without departing from the spirit and scope of the invention as defined in the following claims.

What is claimed is:

1. A semiconductor device, comprising:
   word lines stacked in a cell region of a substrate, wherein each of the word lines is a first conductive layer;
   at least one selection line, formed of a second conductive layer, stacked over the word lines;
   at least one gate line, formed of the second conductive layer, formed in a peripheral region of the substrate; and
   a pipe gate formed between the substrate and the word lines,
   wherein the gate line and the pipe gate are located at substantially the same level.

2. The semiconductor device of claim 1, wherein the first conductive layer includes a metal layer, and the second conductive layer includes a polysilicon layer.

3. The semiconductor device of claim 1, further comprising:
    first contact plugs connected to the word lines;
    at least one second contact plug connected to the at least one selection line; and
    at least one third contact plug connected to the at least one gate line.

4. The semiconductor device of claim 1, further comprising channel layers passing through the word lines and the at least one selection line.

* * * * *